(12) United States Patent
Park

(10) Patent No.: US 7,169,655 B2
(45) Date of Patent: Jan. 30, 2007

(54) FIELD EFFECT TRANSISTORS AND METHODS FOR MANUFACTURING FIELD EFFECT TRANSISTORS

(75) Inventor: Jeong Ho Park, Gyeonggi-do (KR)

(73) Assignee: Dongbu Electronics, Co., Ltd., Seoul (KR)

( * ) Notice: Subject to any disclaimer, the term of this patent is extended or adjusted under 35 U.S.C. 154(b) by 0 days.

(21) Appl. No.: 10/926,874

(22) Filed: Aug. 26, 2004

(65) Prior Publication Data

US 2005/0048730 A1    Mar. 3, 2005

(30) Foreign Application Priority Data

Aug. 30, 2003    (KR)    ............... 10-2003-0060520

(51) Int. Cl.
  *H01L 21/84*    (2006.01)
(52) U.S. Cl. ............... 438/157; 438/164; 438/283; 438/284
(58) Field of Classification Search ............... 438/151, 438/157, 163, 164, 283, 284
  See application file for complete search history.

(56) References Cited

U.S. PATENT DOCUMENTS

| 6,013,553 | A  | * | 1/2000 | Wallace et al. | ............. | 438/287 |
| 6,251,761 | B1 |   | 6/2001 | Rodder et al. |   |   |
| 6,613,658 | B2 | * | 9/2003 | Koyama et al. | ............. | 438/591 |
| 2002/0011612 | A1 | * | 1/2002 | Hieda | ............. | 257/262 |
| 2003/0113972 | A1 | * | 6/2003 | Hayashi et al. | ............. | 438/287 |

FOREIGN PATENT DOCUMENTS

KR    010045239    5/2001

* cited by examiner

*Primary Examiner*—Trung Dang
(74) *Attorney, Agent, or Firm*—Saliwanchik, Lloyd & Saliwanchik

(57) ABSTRACT

FETs and methods for fabricating FETs are disclosed. An illustrated method comprises forming a first insulating layer on a semiconductor substrate; forming a first conductive layer for a fin on the first insulating layer; etching the first conductive layer so that an area of a lower part of the first conductive layer is wider than an area of an upper part of the first conductive layer; forming voltage adjust regions through an ion implantation method; forming a gate insulating layer through a forming gas annealing method; forming a second conductive layer; forming LDD regions by implanting ions into the first conductive layer; forming sidewall spacers adjacent the gate insulating layer; and forming source/drain regions adjacent to the sidewall spacers by implanting ions into the first conductive layer.

4 Claims, 3 Drawing Sheets

FIELD EFFECT TRANSISTORS AND METHODS FOR MANUFACTURING FIELD EFFECT TRANSISTORS

FIELD OF THE DISCLOSURE

The present disclosure relates generally to semiconductor fabrication and, more particularly, to Field Effect Transistors and methods for fabricating Field Effect Transistors (hereinafter referred to as "FETs").

BACKGROUND

In recent years, as the degree of integration has increased, the design rule for the whole process of making the gate electrode, the source/drain region, and the contact holes of a MOSFET has decreased. However, the operating speed of the semiconductor device decreases as the width of its gate electrode, (which is inversely proportional to electric resistance), increases. Polycrystalline silicon/oxide shows the most stable MOSFET characteristics. Therefore, to reduce the electric resistance of the gate electrode, a polycide structure (i.e., a composite structure comprising a silicide layer and a polycrystalline silicon layer) has been used as a low resistance gate with the desired interface characteristics.

A pn junction is formed by implanting n-type or p-type impurities into a p-type or n-type semiconductor substrate. More specifically, the pn junction is fabricated by implanting impurity ions into a semiconductor substrate, and thermally activating the implantation region to form diffusion region(s). A semiconductor device with a narrow width channel should be formed with a shallow depth junction to prevent a short channel effect due to side diffusion from the diffusion region. The source/drain regions of the semiconductor device are also formed as a Lightly Doped Drain (hereinafter referred to as "LDD") structure in order to prevent junction breakdown by a field enhancement effect into the drain and a change of a threshold voltage by a thermal charge effect.

A prior art method of fabricating a MOSFET comprises forming a gate oxide layer over a p-type silicon wafer of a semiconductor substrate, forming a gate electrode of a polycrystalline silicon layer piled by a mask oxide layer (i.e., by an insulating pattern over the gate oxide layer), forming LDD regions over the semiconductor substrate adjacent the sides of the gate electrode, forming spacers on the sidewalls of the gate electrode, and then forming source/drain regions by implanting high density impurities into the surface of the substrate adjacent the sides of the spacers.

However, the above-mentioned prior art method suffers from shortcomings such as a high possibility of a gate oxide integrity (hereinafter referred to as "GOI") failure due to the formation of a thin or abnormal gate insulating layer around the supporting edges of the gate electrode, and deteriorated reliability of the semiconductor device due to dopant penetration of the insulating layer during the formation process of an insulating layer or the later thermal process.

Rodder et al., U.S. Pat. No. 6,251,761, describes a method of fabricating an integrated circuit MOSFET transistor. A method described in the '761 Patent comprises forming a high-k dielectric over a silicon substrate, performing remote plasma nitridation of the high-k dielectric to create a nitride layer over the high-k dielectric, and then forming a conductive layer over the nitride layer forming the gate electrode.

DETAILED DESCRIPTION

Figure 1A:
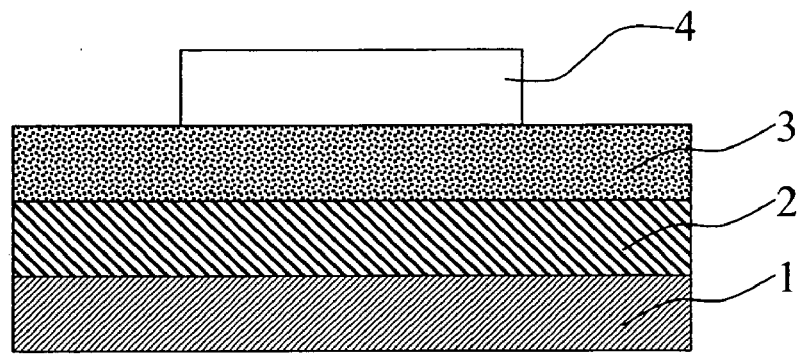
FIGS. 1a through 1e are front, cross-sectional views illustrating an example process of fabricating a fin-FET performed in accordance with the teachings of the present invention.

Referring initially to FIG. 1a, a first insulating layer 2 is formed on a semiconductor substrate 1. A first conductive layer 3 for a fin is deposited on the first insulating layer 2. A photoresist pattern 4 is then formed on the first conductive layer 3.

Figure 1B:
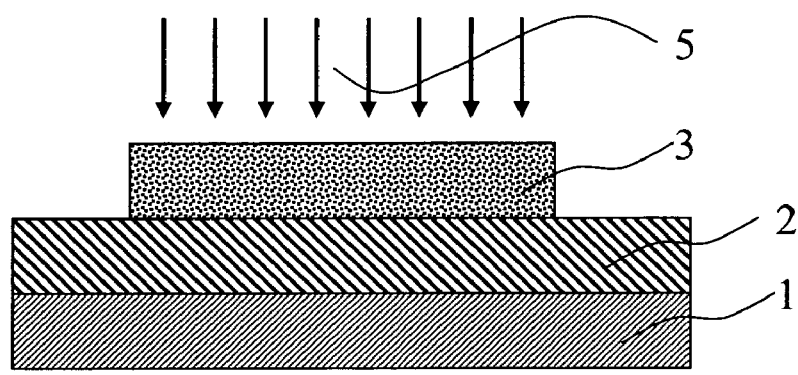

Referring next to FIG. 1b, the first conductive layer 3 is etched by a dry etch method using the photoresist pattern 4 as a mask. The photoresist is removed. Ions for voltage adjust regions are then implanted by an ion implantation method 5. The first conductive layer 3 is etched such that an area of a lower part is wider than an area of an upper part. Thus, the sides of the first conductive layer 3 are formed at a slant. In comparison, a first conductive layer etched in a prior art method is formed at right angles to a substrate. In that prior art approach, when a gate insulating layer (formed in the later process) is formed around the supporting edges of the first conductive layer, problems such as thickness deficiency and abnormal formation of the first conductive layer occur. These problems are solved in the method illustrated herein by etching the first conductive layer 3 such that an area of a lower part is wider than an area of an upper part.

Figure 1C:
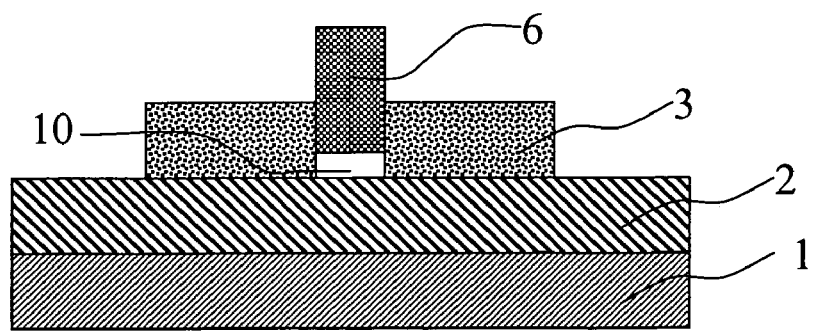

As shown in FIG. 1c, transition metal is next deposited by a sputtering method. A transition metal oxide layer is then formed by a reoxidation method. A transition metal oxynitride for a gate insulating layer 10 is then formed by a forming gas annealing method. A second conductive layer for a gate electrode is deposited, and the gate electrode 6 is then formed by a dry etching method and the exposed gate insulating layer is removed using a photoresist pattern (not shown).

Figure 1D:
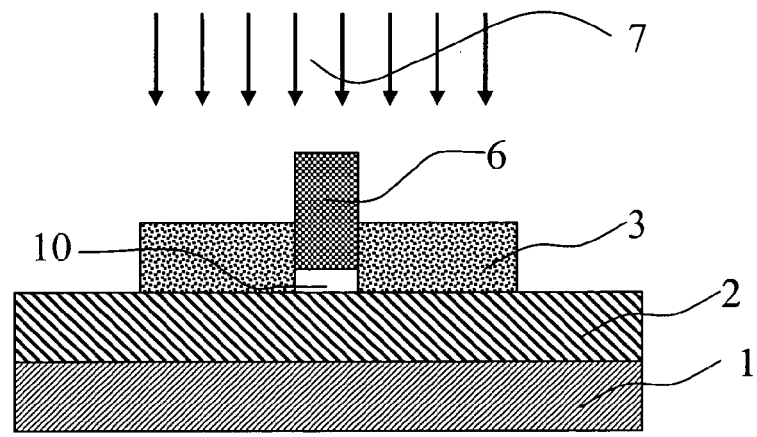

Referring to FIG. 1d, an LDD implantation 7 is performed by an ion implantation method.

Figure 1E:
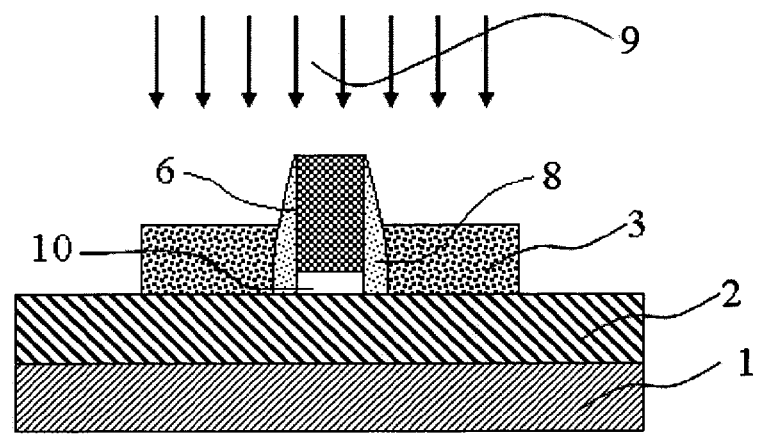

Referring to FIG. 1e, an insulating layer is deposited. Sidewall spacers 8 are then formed by a whole area etch method. Source/drain ion implantation 9 is then performed by an ion implantation method.

Figure 2A:
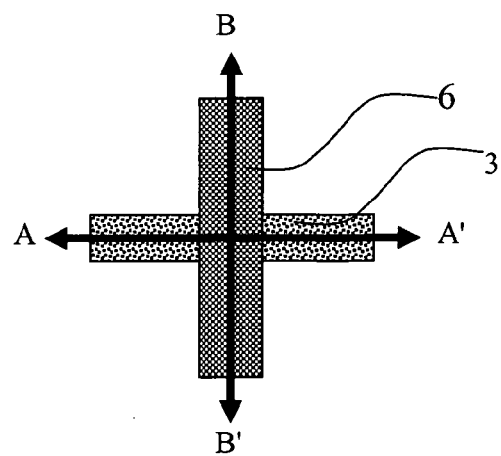
FIG. 2a is a top view of a fin-FET constructed in accordance with the teachings of the present invention.
Figure 2B:
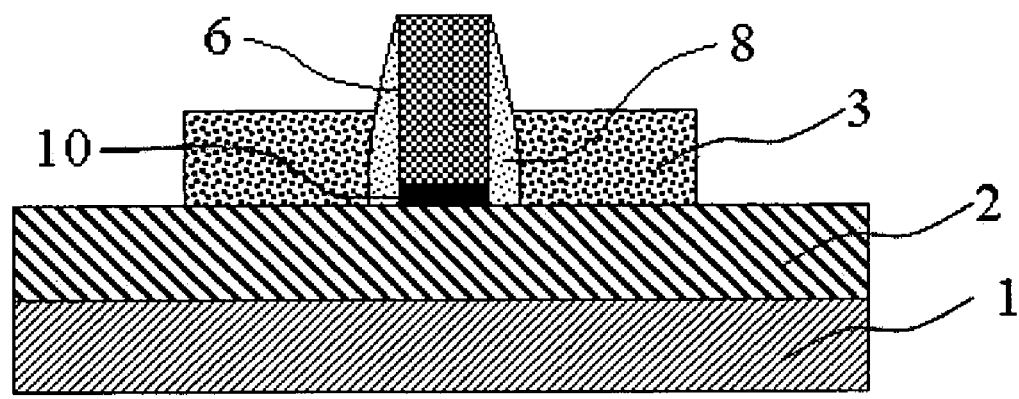
FIGS. 2b and 2c are cross-sectional views illustrating a fin-FET constructed in accordance with the teachings of the present invention.

FIG. 2a is a top view of a fin-FET constructed in accordance with the teachings of the present invention. FIG. 2b shows a cross-sectional view of FIG. 2a taken along line A–A' of FIG. 2A.

FIG. 2b shows the gate insulating layer 10 discussed above in connection with FIG. 1c. The gate insulating layer 10 includes a transition metal oxynitride which is formed by a forming gas annealing method after a transition metal is deposited by a sputtering method and after a transition metal oxide layer is formed by a reoxidation method. The forming gas of the illustrated example comprises an $N_2$ gas or a mixture gas including $N_2$ such as a mixture gas of $N_2$ and $H_2$. Preferably, the temperature of the forming gas is maintained between 200 °C. and 450 °C. The transition metal is preferably a metal selected from the group consisting of Hf, Ta, Al, Zr, V, Ti, Ni, and an alloy including two or more of these transition metal elements. The gate insulating layer 10 preferably has a thickness of between 5 Å and 50 Å.

Figure 2C:
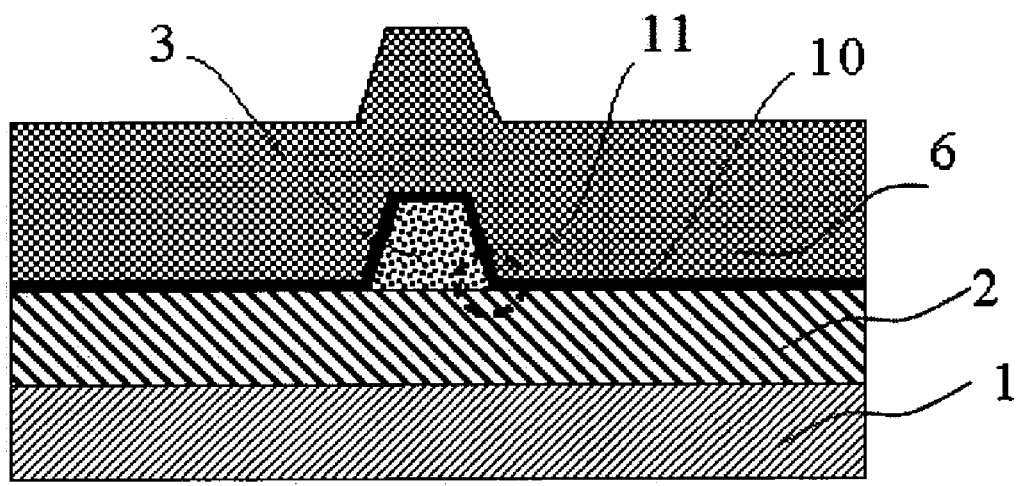

FIG. 2c is a cross-sectional view of the FET of FIG. 2a taken along line B–B'. FIG. 2c shows the slant profile 11 of the first conductive layer 3 which is created during the etching process of the first conductive layer 3 such that an area of a lower part of the first conductive layer 3 is wider than an area of an upper part of the first conductive layer 3. FIG. 2c also illustrates the formation of the gate insulating layer 10 on supporting edges of the fin.

Based on the foregoing, persons of ordinary skill in the art will appreciate that the methods and apparatus illustrated herein avoid a GOI failure by forming a gate insulating layer 10 on a first conductive layer 3 through a forming gas annealing method wherein an area of a lower part of the first conductive layer 3 is wider than an area of an upper part of the first conductive layer 3. In addition, the methods and apparatus illustrated herein also achieve an improved leakage current characteristic by making the area of the lower part in the FET wider than that of the upper part to increase current efficiency and by minimizing dopant penetration into the gate insulating layer 10.

In view of the foregoing, persons of ordinary skill in the art will appreciate that FETs and methods for fabricating FETs have been disclosed. The illustrated methods fabricate a semiconductor device which avoids a GOI failure by forming a gate insulating layer through a forming gas annealing method such that the gate insulating layer includes a lower part and an upper part, and the lower part is wider than the upper part.

The illustrated methods also fabricate a semiconductor device having an improved leakage current characteristic by making the area of the lower part of the FET wider that the area of the upper part of the FET to thereby increase the current efficiency and minimize dopant penetration into the gate insulating layer 10.

An illustrated method comprises fabricating an FET, forming a first insulating layer on a semiconductor substrate, forming a first conductive layer for a fin on the first insulating layer, and etching the first conductive layer so that an area of a lower part of the first conductive layer is wider than an area of an upper part of the first conductive layer, forming voltage adjust regions through an ion implantation method, forming a gate insulating layer through a forming gas annealing method, forming a second conductive layer by depositing a conductive material and removing some portion of the conductive material, forming LDD regions by implanting ions into the first conductive layer, forming sidewall spacers adjacent to the gate insulating layer by depositing and etching an insulating layer, and forming source/drain regions adjacent to the sidewall spacers by implanting ions into the first conductive layer.

It is noted that this patent claims priority from Korean Patent Application Serial Numbers. 10-2003-0060520, which was filed on Aug. 30, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for fabricating an FET comprising:
   forming a first insulating layer above a semiconductor substrate;
   forming a first conductive layer for a fin above the first insulating layer;
   etching the first conductive layer so that an area of a lower part of the first conductive layer is wider than an area of an upper part of the first conductive layer;
   forming voltage adjust regions through an ion implantation method;
   forming a gate insulating layer of transition metal oxynitride by depositing a transition metal or an alloy of transition metals, reoxidizing the transition metal or the alloy of transition metals on the first conductive layer to form a transition metal oxide layer, and performing a forming gas annealing process to form transition metal oxynitride, wherein the forming gas includes $N_2$ and $H_2$;
   forming a second conductive layer on the gate insulating layer,
   patterning the second conductive layer and the gate insulating layer to form a gate electrode, wherein the gate insulating layer is in full contact with the gate electrode between the gate electrode and the first insulating layer and the gate electrode and the first conductive layer;
   forming LDD regions by implanting ions into the first conductive layer;
   forming sidewall spacers on sidewalls of the gate insulating layer and the gate electrode; and
   forming source/drain regions adjacent to the sidewall spacers by implanting ions into the first conductive layer.

2. A method as defined by claim 1, wherein a temperature of the forming gas is between about 200 ° C. and about 450 ° C.

3. A method as defined in claim 1, wherein forming the sidewall spacers comprises depositing and etching an insulating layer.

4. A method as defined in claim 1, wherein the first conductive layer includes inwardly slanted side walls between the lower part and the upper part.

* * * * *